United States Patent
Tu et al.

(10) Patent No.: US 6,311,319 B1
(45) Date of Patent: Oct. 30, 2001

(54) SOLVING LINE-END SHORTENING AND CORNER ROUNDING PROBLEMS BY USING A SIMPLE CHECKING RULE

(75) Inventors: Chih-Chiang Tu, Tauyen; Ren-Guey Hsieh, Ping-Tung, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/083,273

(22) Filed: May 22, 1998

(51) Int. Cl.⁷ .................. G06F 7/60; G06F 17/10
(52) U.S. Cl. .................. 716/19; 716/21; 430/5; 430/22; 430/30
(58) Field of Search .............. 430/5, 22, 30; 716/19, 2, 21; 365/120; 250/492.22; 700/121

(56) References Cited

U.S. PATENT DOCUMENTS

| | | | |
|---|---|---|---|
| 5,208,124 | * 5/1993 | Sporon-Fiedler et al. | 430/5 |
| 5,432,714 | * 7/1995 | Chung et al. | 716/19 |
| 5,553,273 | * 9/1996 | Liebmann | 716/22 |
| 5,657,235 | * 8/1997 | Liebmann et al. | 716/19 |
| 5,707,765 | * 1/1998 | Chen | 430/5 |
| 5,804,340 | * 9/1998 | Garza et al. | 430/5 |
| 5,900,338 | * 5/1999 | Garza et al. | 430/5 |
| 5,965,306 | * 10/1999 | Mansfield et al. | 430/22 |
| 6,044,007 | * 3/2000 | Capodieci | 365/120 |

\* cited by examiner

*Primary Examiner*—Matthew Smith
*Assistant Examiner*—Jibreel Speight
(74) *Attorney, Agent, or Firm*—George O. Saile; Stephen B. Ackerman

(57) ABSTRACT

A methodolgy is described which allows a variety of optical proximity corrections to be added to a mask pattern at low cost and with a view to minimizing the number of electron beam exposures that will be needed later when the reticle is prepared. The basic approach is to add serifs and/or hammerheads to the vertices of the mask pattern on the basis of a small number of simple rule checks. The first check is for the presence of an overlapping pattern at the next level. If this is not detected noting is added at the vertex in question. If some overlap is etected, a predefined search area (at the same mask level) is quickly scanned and, if another stripe is found to be located within a preset distance, serifs are added at the appropriate vertices. If no stripe was found, a second search area, further away, is scanned and if a neighbouring stripe is detected this time, larger serifs are added. If the second search also comes up empty, a hammerhead is added at the appropriate line end. The method may be refined by using additional searches, if so desired.

15 Claims, 5 Drawing Sheets

SOLVING LINE-END SHORTENING AND CORNER ROUNDING PROBLEMS BY USING A SIMPLE CHECKING RULE

FIELD OF THE INVENTION

The invention relates to the general field of image distortion due to Optical Proximity Effects with particular reference to ways to correct for this effect.

BACKGROUND OF THE INVENTION

The proximity effect is a form of optical distortion associated with photoresist images. For a given development time, whether or not a given area of a photoresist layer will be left or removed after the development process depends on the total amount of energy deposited in that area during its exposure to radiation. Image features whose size and/or separation approach the resolution limit of said radiation will thus be subject to distortion that depends on how the diffraction maxima and minima, that lie on both sides of a 'sharp' edge, interact with one another.

The proximity effect can be compensated for, at least in part, by modifying any given feature in the opposite direction to the expected distortion. Thus, a line that would otherwise come out too narrow can be drawn as wider than its true width, etc. The data that represents the information from which a mask suitable for use in photolithography can be generated, is stored in a data file so corrections to allow for the proximity effect will also be stored there. The overall nature and scope of these corrections, and how they get into the file, will vary with the application and the user.

The optical proximity correction (OPC) is commonly calculated by summing two Gaussian functions whose value depend on a critical dimension (CD) defined by the design rules as well as on the wave-length of the exposing radiation. In general, the distortion of lines that are part of a dense assemblage will be more positive than the distortion of isolated lines in optical mode. While OPCs obtained in this manner provide satisfactory results, the computation time can be very long, typically about 16 hours for a single mask file using state of the art computers.

An examination of the changes made to mask images as a result of applying OPC, shows that the OPC takes two principal forms—scatter bars and serifs, the latter category, to which the present invention is limited, includes hammerheads. A serif is a small square that is added to the corner, or vertex, of a stripe. Vertices may be positive or negative, corresponding to whether they are convex or concave. A positive serif extends the boundaries of a positive vertex while a negative serif reduces the boundaries of a negative vertex. A hammerhead may be viewed as the fusion of two serifs, located on adjacent vertices.

Referring now to FIG. 1, an example of a pattern of stripes is shown such as might form part of a layout mask for an integrated circuit. Typically the width of such stripes would be between about 0.18 and 0.35 microns and their minimum separation would be between about 0.18 and 0.35 microns. In this particular example, all stripes (except the stripe labelled 2) have contact holes near their ends so every vertex (except 3 and 4) will need a serif to compensate for its proximity to another object, even though that object happens to be at a lower level within the IC. Prior to the present invention it had been the practice in our laboratory to attach serifs to all vertices, whether or not they actually needed OPC.

This is shown in FIG. 1. This approach was taken because making the necessary changes to the mask data file is very easy and is not time consuming. It should, however, be noted that each serif that is added must be formed separately (by exposure to an electron beam of variable shape) when the actual reticle is being drawn. If many serifs are involved, this can add substantially to the time (and hence the cost) required to prepare a full reticle. It should also be noted that the same amount of electron beam time is required to produce a single hammerhead as a single serif, so that wherever adequate OPC can be obtained by replacing two serifs with a single hammerhead, it is cost effective to do so.

As already noted, the cost of computing the full OPC is very high. Furthermore, a method of OPC that adds only serifs and hammerheads where they are needed would be as effective as the full OPC treatment, provided that the distortions that have not been corrected do not introduce shorts, opens, hot spots, etc. in the line patterns that end up being formed in the integrated circuit. Such a method would therefore be attractive if it substantially reduced the cost of OPC. An important additional benefit of such a method would be the reduced cost of reticle formation discussed above.

A number of approaches have been taken in the prior art to dealing with the proximity effect without the need to perform the full OPC calculation. For example, Liebmann (U.S. Pat. No. 5,553,273 September 1996) aims to correct Optical Proximity Effects by biassing critical portions of the design. In particular, this invention attempts to minimize the creation of new vertices so that it actually teaches away from the practice of using serifs.

Liebmann et al. (U.S. Pat. No. 5,657,235 August 1997) use the OPC data to drive the mask writer itself rather than changing the data design file. By assigning relative mask writer doses, as needed, they are able to bring about continuous line width variations (to compensate for OP effects) without increasing the size of the data design file. Serifs and scatter bars are not involved.

Chung et al. (U.S. Pat. No. 5,432,714 July 1995) show how accumulated information on exposure can be used during electron beam lithography to compensate for proximity effects. Sporon-Fiedler et al. (U.S. Pat. No. 5,208,124 May 1993) teach increasing and decreasing line features to compensate for proximity effects. Serifs and hammerheads are not used here either. It is thus apparent that none of the above references offer the simplicity of application provided by the present invention.

SUMMARY OF THE INVENTION

It has been an object of the present invention to provide a process whereby optical proximity corrections may be applied to a mask pattern, such as used in the manufacture of integrated circuits, at minimum cost.

Another object has been that said process lead to a reduction in the cost of preparing a reticle from said mask pattern.

These objects have been achieved by adding serifs and/or hammerheads to the vertices of the mask pattern on the basis of a small number of simple rule checks. The first check is for the presence of an overlapping pattern at the next level. If this is not detected nothing is added at the vertex in question. If some overlap is detected, a predefined search area (at the same mask level) is quickly scanned and, if another stripe is detected to be located within a preset distance, serifs are added at the appropriate vertices. If no stripe was found a second search area, further away, is scanned and if a neighbouring stripe is detected this time, larger serifs are added. If the second search comes up empty, a hammerhead is added at the appropriate line end. The method may be refined by using additional searches, if so desired.

DESCRIPTION OF THE PREFERRED EMBODIMENTS

As discussed earlier, the present invention seeks to limit OPC measures to serifs and hammerheads. To limit the cost of doing this selectively (rather than indiscriminately as was our prior practice) we have developed a set of simple rules that are readily checked and, depending on the outcome in each case, a serif or a hammerhead may or may not be added.

Checking of the mask pattern is performed on the numerical representation of the pattern that is stored in a machine readable file. Included in the file is information concerning the locations of the four vertices that make up each stripe. Thus the distance from any point along a stripe edge to its nearest neighbouring stripe (including stripes at other levels) is readily calculated.

Figure 2:
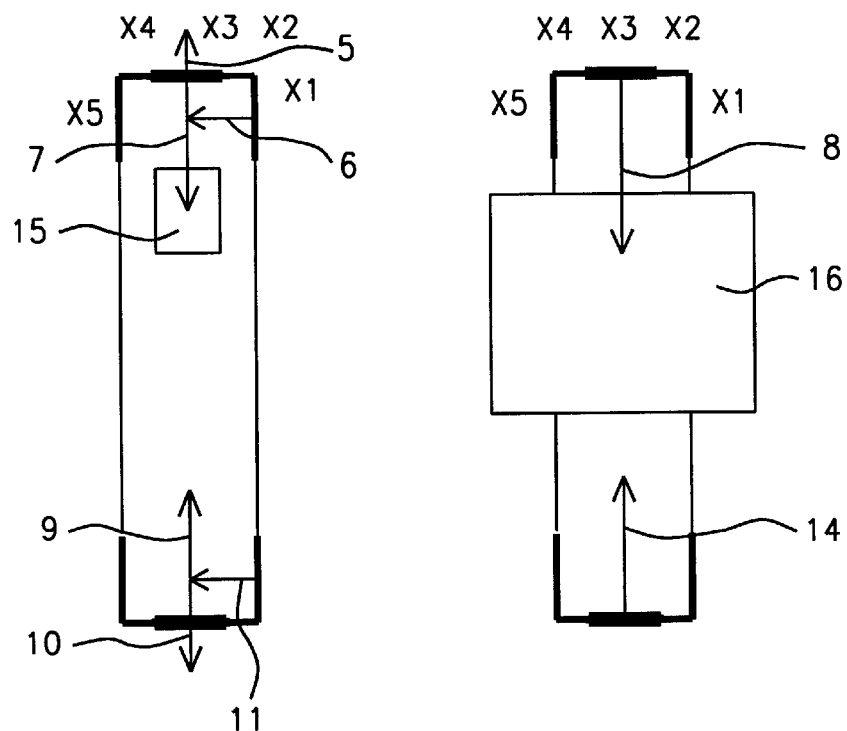
FIG. 2 illustrates how the inter-level rule check is performed.

The first check that needs to be made is for neighbouring stripes on a different level (the inter-level check). The way this is done is illustrated in FIG. 2. Of particular interest is the distance from the end of the stripe (which we will call the line end). For convenience, the line end has been broken into 5 segments X1–X5. These are given varying thicknesses in the diagram for illustrative purposes only. In practice, the segments that make up a line end are defined in terms of their numerical co-ordinates. The lengths of segments X1 and X5 (i.e. how far they extend away from the corner) is dependent on the design rules and on the wafer processing associated with each layer. Normally, we would try to make X1=X3= X4 about one third of the line width and X1=X5 about half a line width.

Continuing our reference to FIG. 2, vectors 5—11 and 14 indicate the direction and distance from the line end in which a search is performed. In general their direction is perpendicular to the line end and the distance they represent is between about 0.18 and 0.5 microns. If a location implied by one of these vectors is found to be within a stripe on a lower level then the inter-level check was positive and a search for intra-level neighbours can be conducted (see below). If the outcome was negative then no serifs or hammerhead will be added at this line end and the next unprocessed line end can be considered. As can be seen, the inter-level check is conducted mainly inwards as the intent is to find stripes that overlap each other. Vectors 5 and 10 are both directed outwards but their distance from the line end is very small.

Vector 6 looks for overlap near the line end along the stripe's center while vectors 7, 8, 9, and 14 all look along the center of the stripe to a point well beyond the segments X1 and X5. In these examples positive inter-level checks resulted from the detection of via hole 15 and oxide layer 16 by search vectors 7 and 8 respectively.

If the inter-level check was positive the intra-level check is made by getting an approximate value for the distance to the next closest stripe (nearest neighbour distance). To determine this distance, a search or detection area needs to be predefined for each line end. If no stripe co-ordinates are found within this area, then the distance to any nearest neighbour is known to exceed the dimension of the detection box. Similarly, if a stripe is found to be within the detection area, the minimum distance to a neighbour will be known and a serif or hammerhead can be assigned accordingly.

By successively checking with several detection areas of increasing distance and/or size, an approximate value for the nearest neighbour distance can thus be obtained very rapidly and the appropriate serif can be assigned.

Figure 3:
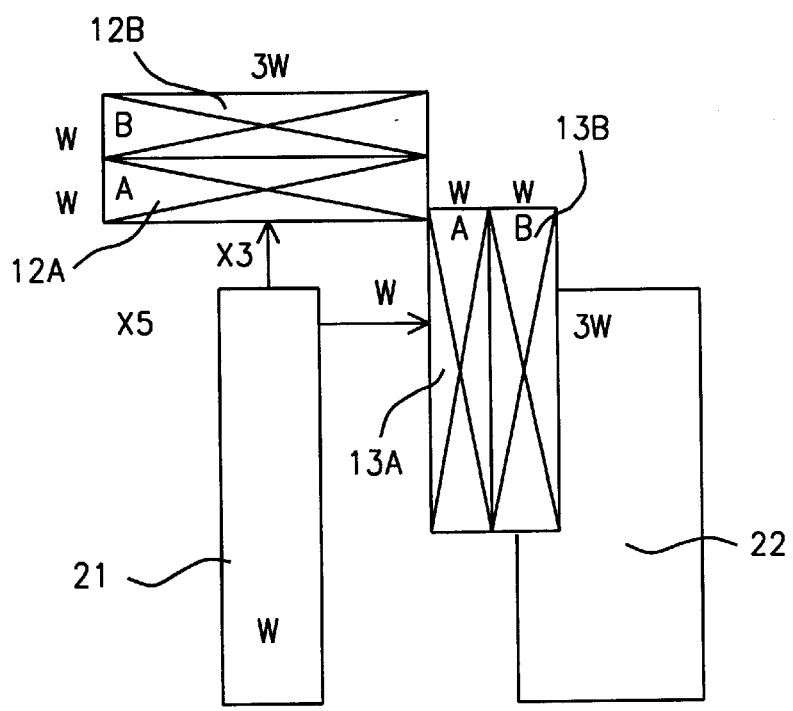
FIG. 3 illustrates how the intra-level rule check is performed.

In FIG. 3 we show in somewhat more detail how the search areas are set up. Two stripes, 21 and 22 are shown and the search is to be conducted from the top of 21.

Two search (detection) areas A and B have been defined. They are of the same size and shape but area B is to be about twice as far from any given segment as area A. The long dimension of a search area is about three times the width of the stripe. Its other dimension is about the same as the stripe width. Typically, area A would measure between about 0.18 and 0.35 by about 0.54 and 1.05 microns, and would be located between about 0.18 and 0.35 microns from a segment, while area B would measure between about 0.18 and 0.35 by about 0.54 and 1.05 microns, and would be located between about 0.36 and 0.7 microns from a segment. The search is conducted, first for area A and, if nothing is detected, again for area B. Examples of search areas A, emanating from segments X1 and X3, are shown in boxes 13A and 12A, respectively, while examples of search areas B, emanating from segments X1 and X3, are shown in boxes 13B and 12B, respectively. Note that FIG. 3 is only an example. In general, searches would be performed at areas X1, X3, and X5 with areas A and B being adjusted, depending on process requirements.

Figure 4B:
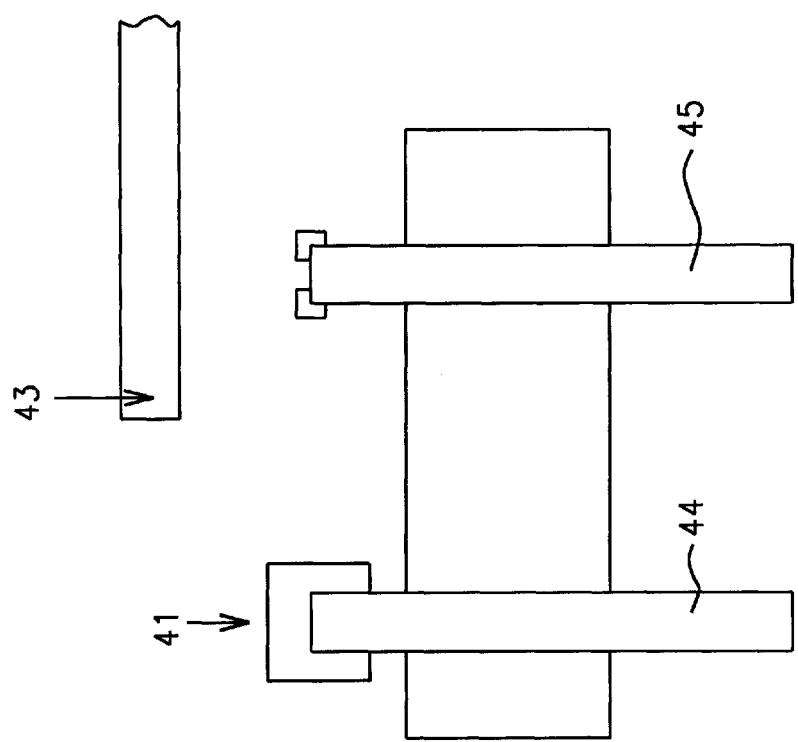
FIG. 4B illustrates the selective assignment of serifs together with their replacement by hammerheads, where appropriate.

Continuing our reference to FIG. 3, it can be seen that the search from 21 based on area A did not encounter another stripe whereas the search based on area B detected the nearby presence of stripe 22. The size of the serifs that are to be attached at the vertices will depend on how far away the detected stripe lies—the further away the larger the serif. In other words, line ends that detect stripes in area A will receive smaller serifs (typically measuring between about 0.04 and 0.12 by 0.04 and 0.12 microns) than those that detected a stripe only when area B was searched. In the latter case, serif sizes will be between about 0.12 and 0.24 by 0.12 and 0.24 microns If no stripes are detected in either areas A or B, the line end is given a hammerhead. This is an extension of the line end to increase its size along segments X1 through X5. An example of this can be seen in FIG. 4B where hammerhead 41 has been added to the end of 44. The width of the hammerheads is typically between about 0.22 and 0.45 microns. It is also possible to vary the width of the hammerhead so that it is wider wherever there is no other nearby stripe. This can arise when a neighbour is detected at one vertex of a line end but not at the other. At the first vertex a serif will be attached while the negative intra-layer check at the second vertex results in a hammerhead. Since the serif is narrower than the hammerhead, the merger of the two results in a hammerhead that is wider on the side where there are no neighbours. Note (also in FIG. 4B) the absence of serifs or hammerheads at line ends 43 and 47. This is because no other level's presence (in this case poly layer 45) was detected there.

Figure 4A:
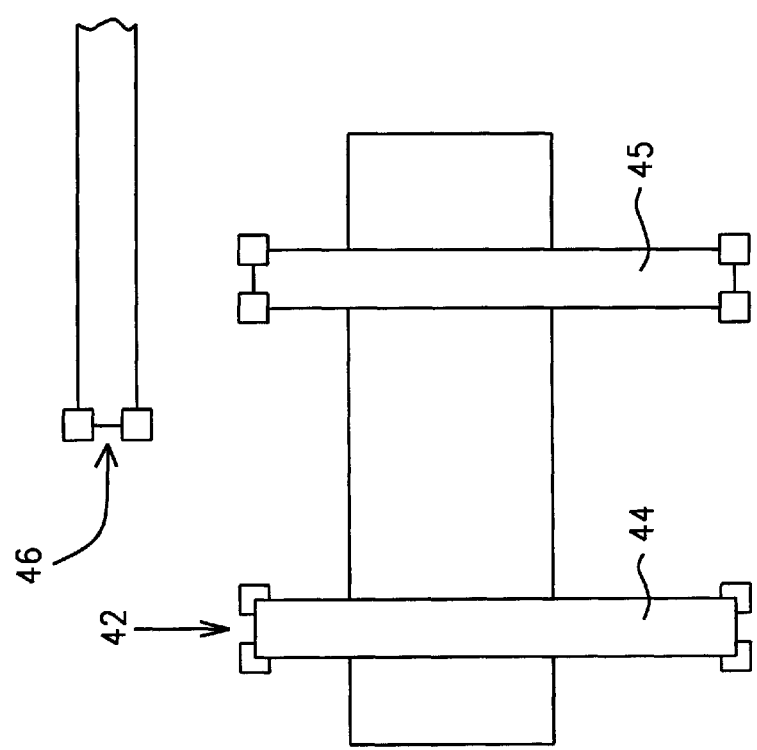
FIG. 4A shows how serifs used to be assigned indiscriminately in our previous methodology.

For comparison, FIG. 4A shows OPC as implemented using our earlier methodology. In this case, serifs were placed at all vertices, regardless of whether or not other stripes were nearby. For example, compare 46 with 43. Also, no hammerheads have been used even though, where they could be used, a savings in electron beam exposure time while drawing the reticle would result. For example, compare 41 with 42.

Figure 5:
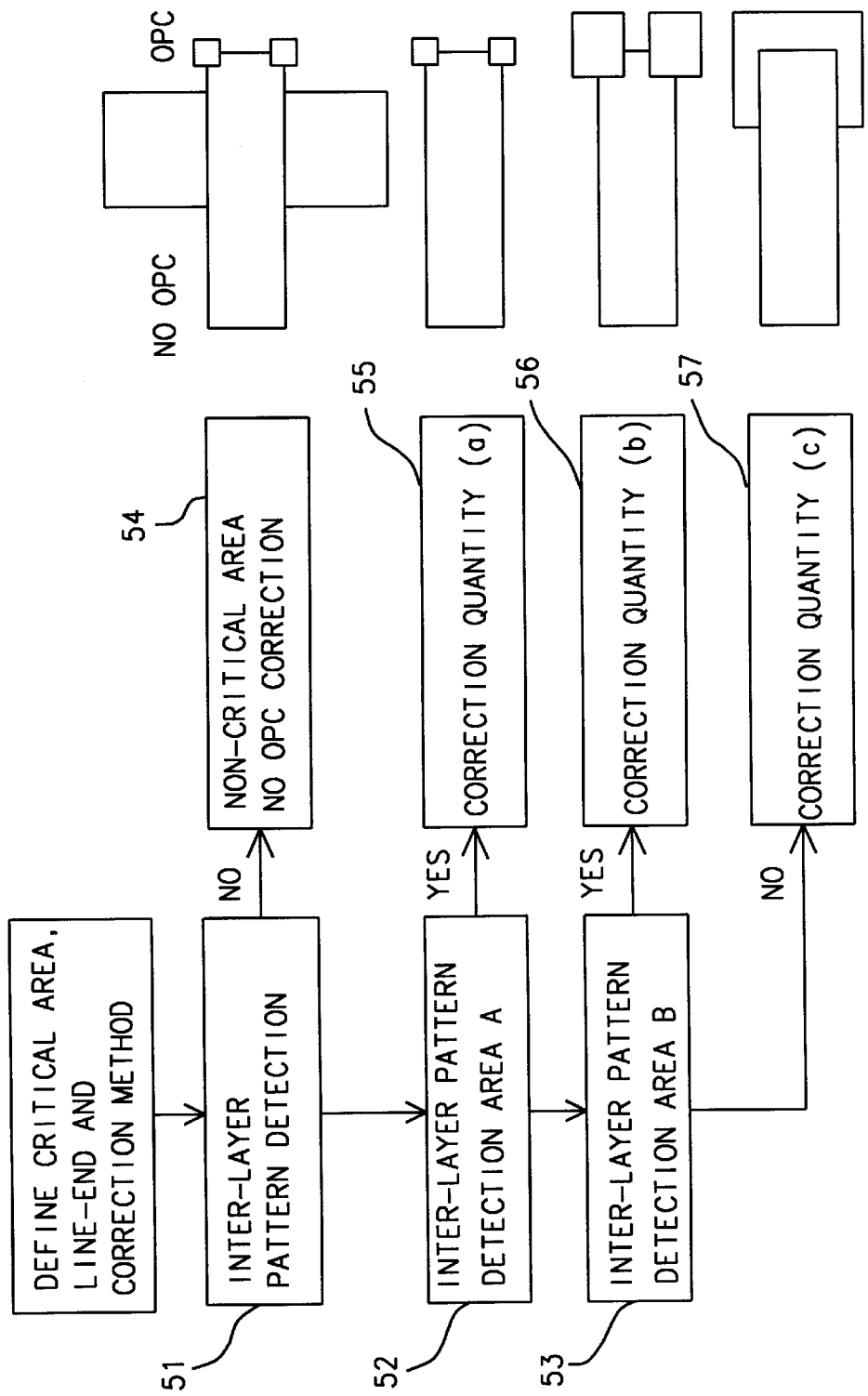
FIG. 5 is a flowchart representation of the process of the present invention.

FIG. 5 is a flow chart summary of the full process. Each type of corrective feature (55–57), if any (54), resulting from each of the steps (51–53) is illustrated to the right of that step.

Figure 1:
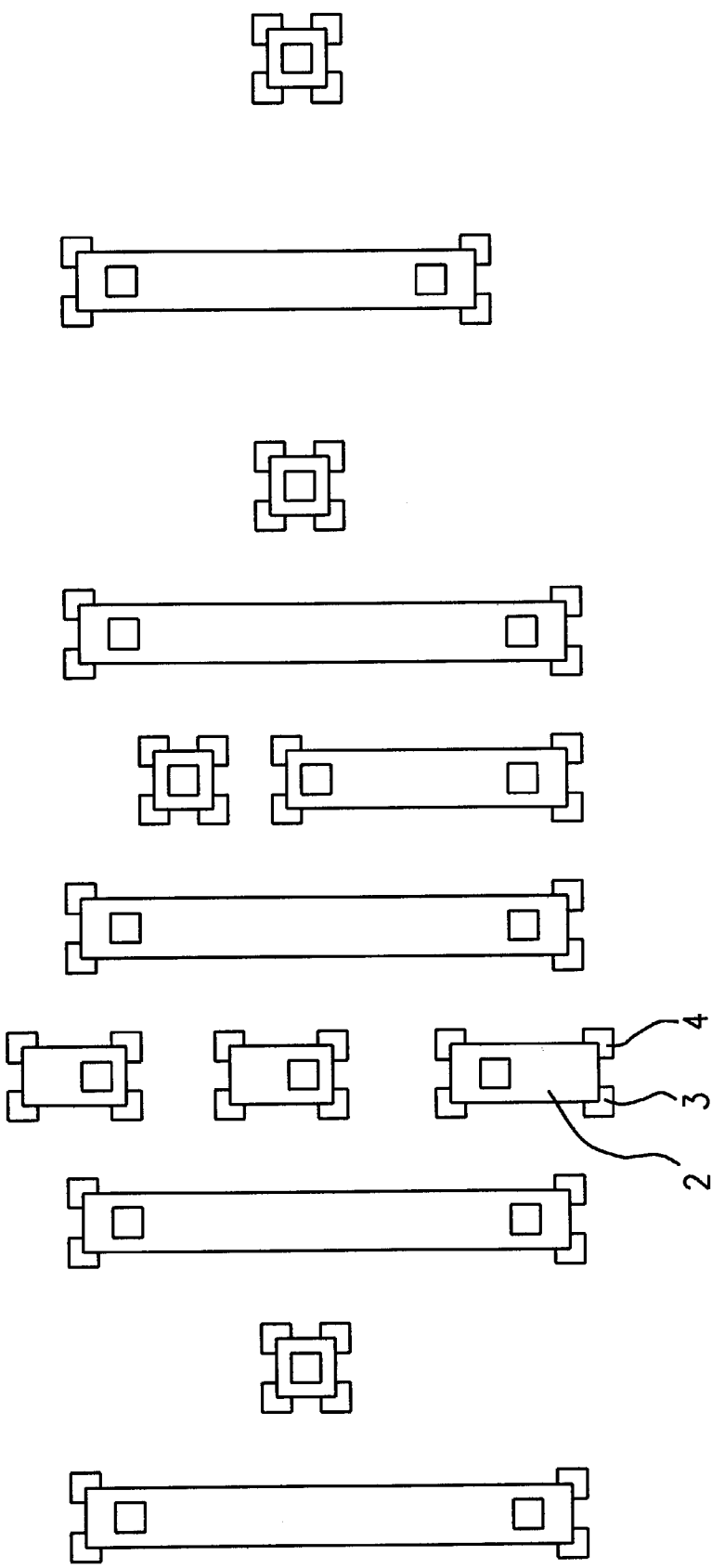
FIG. 1 shows a mask pattern to which OPC features have been applied according to our previous methodology.
Figure 6:
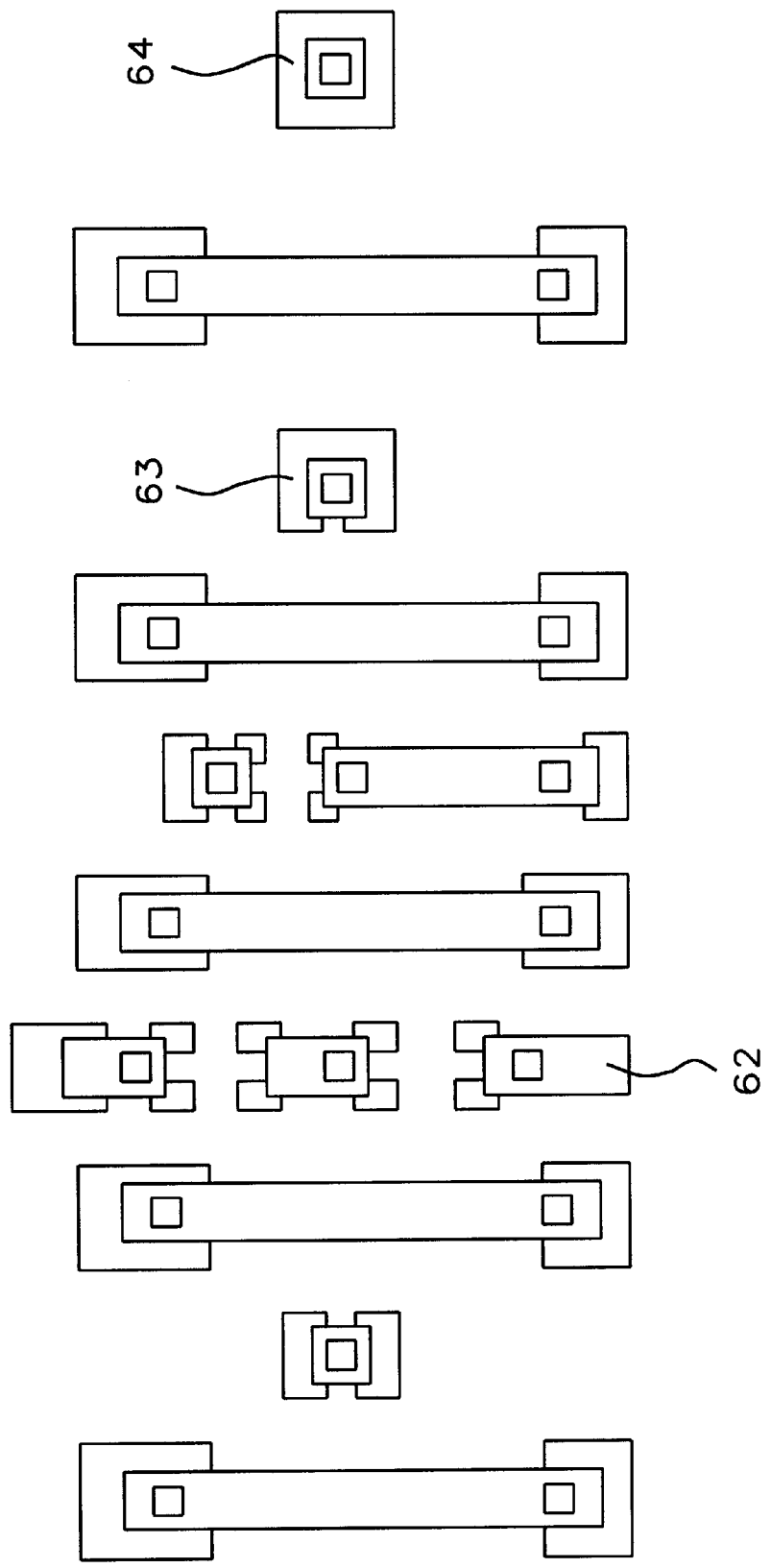
FIG. 6 shows the mask pattern of FIG. 1 when OPC features have been applied according to the teachings of the present invention.

Several examples of the methodology summarised in FIG. 5 are featured in FIG. 6 which shows how the mask pattern first seen in FIG. 1 appears after being processed according to the present invention. Since most of the stripes in this particular example include via holes at both ends serifs or hammerheads have been added as appropriate. The notable exception is 62 which would have a negative inter-layer check (no via hole) and therefore no serifs were needed. In most cases, two serifs have been replaced by a single hammerhead and in two of these (63 and 64) all four serifs were replaced by single hammerheads resulting from the fusion of two serifs with a hammerhead (63) or the fusion of two or more hammerheads into one (64). Aside from the benefits of being able to selectively add a variety of (more suitable) OPC features, the number of separate electron beam exposures needed in the preparation of the reticle has been reduced from 52 (FIG. 1) to 29 (FIG. 6).

While the invention has been particularly shown and described with reference to the preferred embodiments thereof, it will be understood by those skilled in the art that various changes in form and details may be made without departing from the spirit and scope of the invention. For example, the process described above could be generalized to search from each vertex (as opposed to a line end) over a range of directions for a range of distances. This would result in a more precise determination of the nearest neighbour distances and allow the dimensions of the serifs and the hammerheads to be adjusted to suit each particular situation.

What is claimed is:

1. A method to correct for the optical proximity effect, comprising:

providing upper and lower mask patterns comprising stripes that have edges, represented in a common numerical format that includes vertex co-ordinates; then for the upper mask pattern, executing the steps of:

determining, for a vertex, a minimum separation from any stripes of the lower mask;

if said minimum separation exceeds a preset value proceeding to another vertex, else computing a first distance, along a first direction, to a first closest edge, and a second distance, along a second direction perpendicular to said first direction, to a second closest edge;

at said vertex, adding to the pattern a serif whose width in said first and second directions, and whose length in said second and first directions, varies, to some maximum, in proportion said first and second distances, respectively;

if no serif was added to either said vertex or to an adjoining vertex in the same stripe, adding a hammerhead that wraps around both of these vertices; and repeating the foregoing steps until all vertices in the pattern have been considered.

2. The method of claim 1 wherein the stripes have a width that is between about 0.18 and 0.35 microns.

3. The method of claim 1 wherein said minimum separation is about 0.18 microns.

4. The method of claim 1 wherein the serifs have a width that is between about 0.04 and 0.24 microns.

5. The method of claim 1 wherein said first direction is perpendicular to a stripe edge.

6. The method of claim 1 wherein said first and second distances are between about 0.18 and 0.35 microns.

7. A process for optical proximity correction comprising the sequential steps of:

(a) providing a mask pattern that includes stripes having line ends;

(b) defining first, second, and third detection areas for each line end;

(c) choosing a line end;

(d) determining if, relative to a lower layer, an inter-layer pattern exists within the first detection area of the chosen line end;

(e) if no inter-layer pattern is detected, proceeding to step (k);

(f) determining if an intra-layer pattern exists within the second detection area of the chosen line end;

(g) if an intra-layer pattern is detected within the second detection area, adding a first pair of serifs to the chosen line end and proceeding to step (k);

(h) determining if an intra-layer pattern exists within the third detection area of the chosen line end;

(i) if an intra-layer pattern is detected within the third detection area, adding a second pair of serifs to the chosen line end and proceeding to step (k);

(j) adding a hammerhead to the chosen line end; and (k) if unprocessed line ends remain, choosing a line end that has not yet been processed and returning to step (d).

8. The process recited in claim 7 wherein each line end further comprises multiple segments.

9. The process of claim 8 wherein said first detection area is a point located a predefined distance from a segment.

10. The process of claim 7 wherein said first detection area is located between about 0.18 and 0.35 microns from the chosen line end.

11. The process of claim 7 wherein said second detection area is located between about 0.36 and 0.7 microns from the chosen line end.

12. The process of claim 7 wherein said second detection area measures between about 0.18 and 0.35 microns by about 0.54 and 1.05 microns.

13. The process of claim 7 wherein the first pair of serifs each measures between about 0.04 and 0.12 microns by about 0.04 and 0.12 microns.

14. The process of claim 7 wherein the second pair of serifs each measures between about 0.12 and 0.24 microns by about 0.12 and 0.24 microns.

15. The process of claim 7 wherein said hammerhead wraps around three sides of a line end with a width that increases with its nearest neighbour distance.

* * * * *